(12) United States Patent
Iadanza

(10) Patent No.: US 6,960,837 B2
(45) Date of Patent: Nov. 1, 2005

(54) METHOD OF CONNECTING CORE I/O PINS TO BACKSIDE CHIP I/O PADS

(75) Inventor: Joseph A. Iadanza, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 248 days.

(21) Appl. No.: 09/683,872

(22) Filed: Feb. 26, 2002

(65) Prior Publication Data
US 2003/0160293 A1 Aug. 28, 2003

(51) Int. Cl.⁷ .................... H01L 23/48; H01L 23/52; H01L 29/40
(52) U.S. Cl. .................... 257/774; 257/503; 257/697
(58) Field of Search .................... 257/459, 203, 257/204, 207, 211, 737, 774, 758, 780, 781, 257/784, 503, 697; 438/118, 617, 618

(56) References Cited

U.S. PATENT DOCUMENTS

| 4,617,730 A | * | 10/1986 | Geldermans et al. | 29/843 |
| 5,375,042 A | * | 12/1994 | Arima et al. | 361/784 |
| 5,406,125 A | * | 4/1995 | Johnson et al. | 257/774 |
| 6,075,712 A | * | 6/2000 | McMahon | 361/783 |
| 6,291,272 B1 | * | 9/2001 | Giri et al. | 438/121 |
| 6,617,681 B1 | * | 9/2003 | Bohr | 257/700 |

* cited by examiner

Primary Examiner—George Eckert
Assistant Examiner—Edgardo Ortiz
(74) Attorney, Agent, or Firm—Schmeiser, Olsen & Watts; Anthony Canale

(57) ABSTRACT

An integrated circuit, comprising: a predefined block of functional circuitry having a plurality of I/O pins; and a backside I/O pad electrically connected to each I/O pin through a backside via of the integrated circuit.

19 Claims, 11 Drawing Sheets

METHOD OF CONNECTING CORE I/O PINS TO BACKSIDE CHIP I/O PADS

BACKGROUND OF THE INVENTION

1. Field of the Invention

The present invention relates to the field of application specific integrated circuits (ASICs); specifically, it relates to a method for connecting core I/O pins to chip I/O pads and more specifically to backside chip I/O pads.

2. Background of the Invention

With the advance of semiconductor technology, the need for integration to system-on-a-chip (SOC) levels within the ASIC field has increased. While reductions in feature sizes and power supply voltage levels have allowed significant integration improvements, these same integration improvements have made inclusion of complex cores (including analog, mixed signal, memory, and specialty cores) more difficult. For example, certain cores require power supply voltages and/or power consumption levels, which are not compatible with the non-core devices and circuits. Further, while the physical number of interconnection (wiring) levels has increased, the number of physical chip I/Os has become a limiting factor as chip sizes have decreased. Moving from peripheral I/O layout to array I/O layout has also raised new problems. Array I/O allow cores to be positioned anywhere within a chip and designers are placing cores closer to the circuit modules the core supports, raising chip I/O routing and competition issues, power distribution and signal noise issues and modeling and testing issues. These issues impact cost, reliability, design time and overall time to market in a field (ASIC) where cost and time to market are critical concerns.

FIGS. 1 and 2 are exemplary of the physical features and topography of an SOC ASIC utilizing array chip I/O's and containing a core.

FIG. 1 is a partial cross-sectional view of a related art integrated circuit chip. In FIG. 1, integrated circuit chip 100 comprises a silicon substrate 105 on which, a multiplicity of interconnection levels 110 are fabricated. Fabricated between silicon substrate 105 and interconnection levels 110 is a device level 115. Interconnection levels 110 include in order above silicon substrate 115, an M1 level 120, an M2 level 125, an M3 level 130, an M4 level 135, an MT level 140 and a passivation level 145. On top of passivation level 145 are chip I/O pads 150 supporting solder balls 155.

Substrate 105 generally contains the semiconductor portions of devices such as the source, drain, and channels of metal-oxide-silicon (MOS) transistors and device level 115 generally contains the non-semiconductor portions of devices such as the gates of MOS transistors. Each level of interconnection levels 110 includes an insulator, wires formed in the insulator and conductive vias connecting the wires in one level to wires in another level. Interconnect levels 110 wire up devices formed in silicon substrate 105 and device level 115 into circuits and connect those circuits to chip I/O pads 150.

Contained within chip 100, is a core 160. Core 160 includes portions of silicon substrate 105, device level 115, M1 level 120, M2 level 125 and M3 level 130 that are reserved for core devices and circuits. Core 160 is divided into a core circuit portion 165 and a redistribution portion 170. There are no devices in the portions of silicon substrate 105 and device level 115 contained in redistribution portion 170. There is no wiring in portions of M1 level 120 and M2 level 125 contained within redistribution portion 170. A plurality of core I/O pins 175 are located in redistribution portion 170 at M3 level 130. Global wiring in M3 level 130, M4 level 135, MT level 140 and passivation level 145 electrically connect core I/O pins 175 to chip I/O pads 150.

FIG. 2 is a partial plan view of the related art integrated circuit chip of FIG. 1. In FIG. 2, core I/O pins 175 of core 160 are electrically connected to chip I/O pads 150 by global wiring 180. The exact routing of global wiring 180 is determined based upon electrical parameter wiring rules such as line resistance and capacitance, power distribution rules limiting voltage drop and current hot-spots and physical wiring rules such as wire width and length matching. While global wiring may be done by software, designs still need to be simulated (tested) and corrections made multiple times and often by human intervention.

The present invention provides a method to address chip I/O availability in SOC ASIC chips having cores to minimize cost, design time and overall time to market.

BRIEF SUMMARY OF THE INVENTION

A first aspect of the present invention is an integrated circuit, comprising: a predefined block of functional circuitry having a plurality of I/O pins; and a backside I/O pad electrically connected to each I/O pin through a backside via of the integrated circuit.

A second aspect of the present invention is a method of making electrical connection to an integrated circuit, comprising: providing a predefined block of functional circuitry having a plurality of I/O pins; and connecting a backside I/O pad electrically to each I/O pin through a backside via of the integrated circuit.

A third aspect of the present invention is an electronic device, comprising: (a) an integrated circuit package; (b) an integrated circuit chip comprising: (i) a predefined block of functional circuitry having a plurality of first I/O pins, each first I/O pin electrically connected to a backside I/O pad of the integrated circuit; and (ii) non-predefined functional circuitry having a plurality of second I/O pins, each second I/O pin electrically connected to a frontside I/O pad of the integrated circuit; (c) first connection means for electrically connecting each backside I/O pad to one pad of a first set of package pads; and (d) second connection means for electrically connecting each frontside I/O pad to one pad of a second set of package pads.

A fourth aspect of the present invention is an electronic device, comprising:(a) a first integrated circuit chip comprising:(i) a predefined block of functional circuitry having a plurality of first I/O pins, each first I/O pin electrically connected to a backside I/O pad of the integrated circuit; and (ii) non-predefined functional circuitry having a plurality of second I/O pins, each second I/O pin electrically connected to a frontside I/O pad of the integrated circuit;(b) a second integrated circuit chip mounted to a back surface of the first integrated circuit chip, the second integrated circuit chip having a plurality of frontside I/O pads; and (c) connection means for electrically connecting each backside I/O pad of the first integrated circuit chip to one frontside I/O pad of the second integrated circuit chip.

BRIEF DESCRIPTION OF THE SEVERAL VIEWS OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

In describing the present invention, an exemplary integrated circuit chip utilizing six interconnection levels and one core will be used. The invention is equally applicable to integrated circuit chips having more or less than six interconnection levels and more than one core. A core includes, in the substrate and interconnect levels, all devices and structures in a specified portion of a chip necessary to perform the function of the core and non-core devices and wiring are excluded from the core. A core is a pre-defined block of functional circuitry contained in a design library and is placed into a chip design that may contain non-predefined circuitry, that is, circuitry designed from non-functional units such as gates. Cores may be as simple as just a driver circuit or as complex as a multi-channel analog to digital converter circuit or a full function embedded content addressable memory (CAM) circuit. Core I/O pins include signal I/O pins, power I/O pins, ground I/O pins and test I/O pins.

Figure 3:
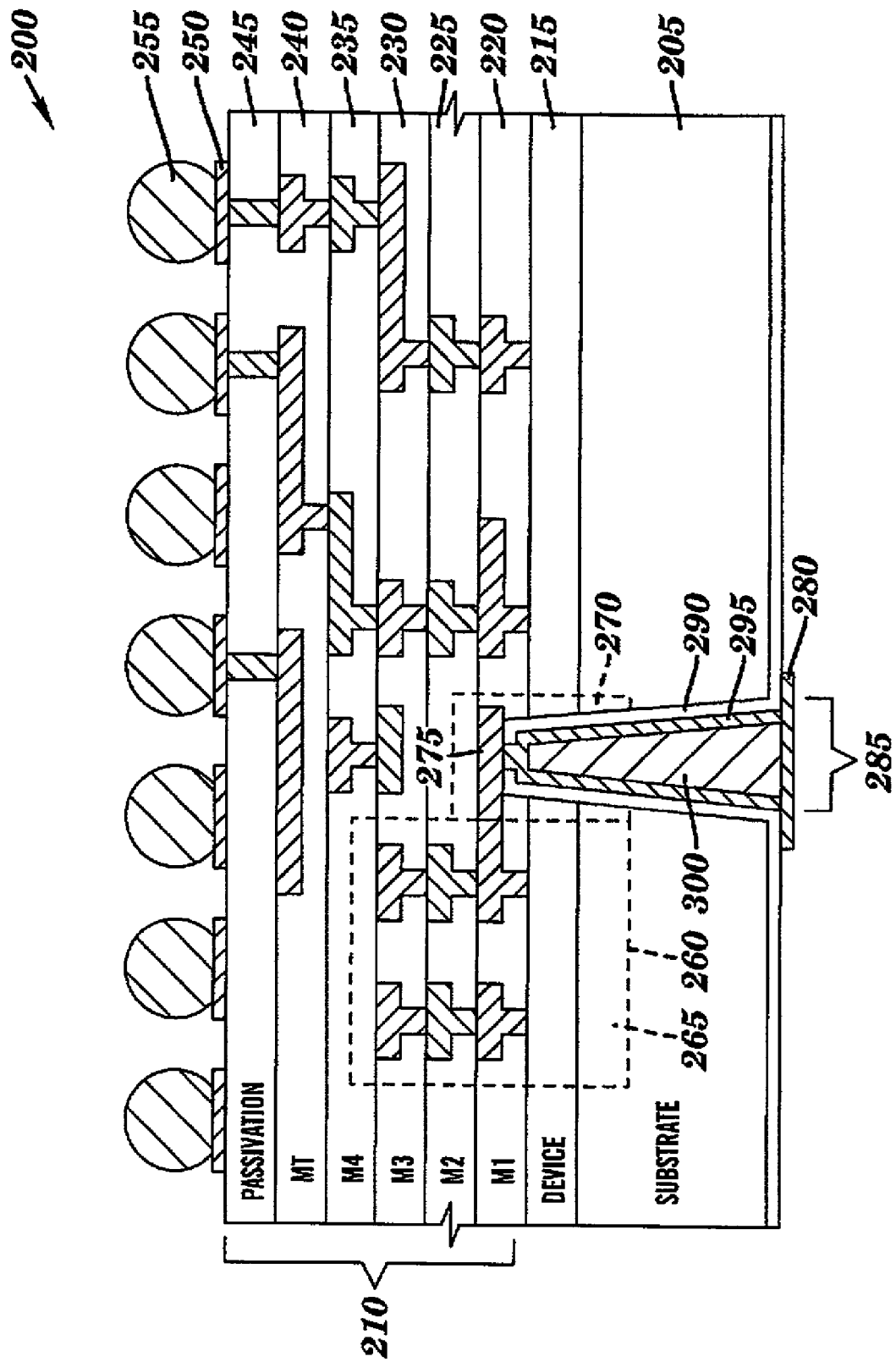
FIG. 3 is a partial cross-sectional view of an integrated circuit chip according to the present invention.

FIG. 3 is a partial cross-sectional view of an integrated circuit chip according to the present invention. In FIG. 3, integrated circuit chip 200 comprises a substrate 205 on which, a multiplicity of interconnection levels 210 are fabricated. Substrate 205 may be a bulk silicon substrate or an SOI substrate. Fabricated between silicon substrate 205 and interconnection levels 210 is a device level 215. Interconnection levels 210 include in order above silicon substrate 215, an M1 level 220, an M2 level 225, an M3 level 230, an M4 level 235, an MT level 240 and a passivation level 245. M1 level 220 is the lowest interconnect level in integrated circuit chip 200. On top of passivation level 245 are frontside chip I/O pads 250 supporting solder balls 255. Solder balls 255 are also called C4 connections, C4 standing for controlled collapse chip connection.

While five interconnection levels (M1, M2, M3, M4 and MT) are illustrated in integrated circuit chip 200 in FIG. 3, one of ordinary skill in the art would known that more or less interconnection levels may be employed.

Substrate 205 contains the semiconductor portions of devices such as the source, drain, and channels of metal-oxide-silicon (MOS) transistors and device level 215 contains the non-semiconductor portions of devices such as the gates of MOS transistors. Each level of interconnection levels 210 includes an insulator, wires formed in the insulator and conductive vias connecting the wires in one level to wires in another level. Interconnect levels 210 wire up devices formed in substrate 205 and device level 215 into circuits and connect those circuits to chip I/O pads 250.

Contained within integrated circuit chip 200, is a core 260. Core 260 includes portions of substrate 205, device level 215, M1 level 220, M2 level 225 and M3 level 230 that are reserved for core devices and circuits. Excluded from core 260 are all non-core devices and other structures. Core 260 is divided into a core circuit portion 265 and a redistribution portion 270. Circuit portion 265 includes portions of substrate 205, device level 215, M1 level 220, M2 level 225 and M3 level 230. Circuit portion 265 includes all functional circuitry of core 260. Redistribution portion 270 includes only portions of substrate 205, device level 215 and M1 level 220. There are no devices in the portions of substrate 205 and device level 215 contained in redistribution portion 270. Portions of M2 level 225 and M3 level 230 immediately above redistribution portion 270 are available for wiring to non-core circuits and devices. A plurality of core I/O pins 275 are located in redistribution portion 270 at M1 level 220.

While three interconnection levels (M1, M2 and M3) are illustrated in core 260 in FIG. 3, one of ordinary skill in the art would known that more or less interconnection levels may be employed.

Core I/O pins 275 are electrically connected to backside chip I/O pads 280 by conductive backside vias 285 formed in substrate 205, device level 215 and M1 level 220. Each conductive backside via 285 includes an insulating liner 290, a conductive liner 295 and a bulk conductor 300. Insulating liner 290 insulates conductive backside via 285 from substrate 205. Backside chip I/O pads 280 and conductive backside vias 285 are included in the design of core 260 and form part the core. As shown in FIG. 3, the backside via 285 may have sloped sidewalls; i.e., the sidewalls of the backside via 285 in FIG. 3 are inclined and not perpendicular to the backside chip I/O pad 280. In addition, the backside chip I/O pad 280 is shown in FIG. 3 as being in direct mechanical contact with bulk conductor 300 that is comprised by the backside via 28. However, a portion of the backside chip I/O pad 280 is shown in FIG. 3 as not in direct mechanical contact with the backside via 28 and in direct mechanical contact with the backside surface of the integrated circuit chip 200.

Figure 1:
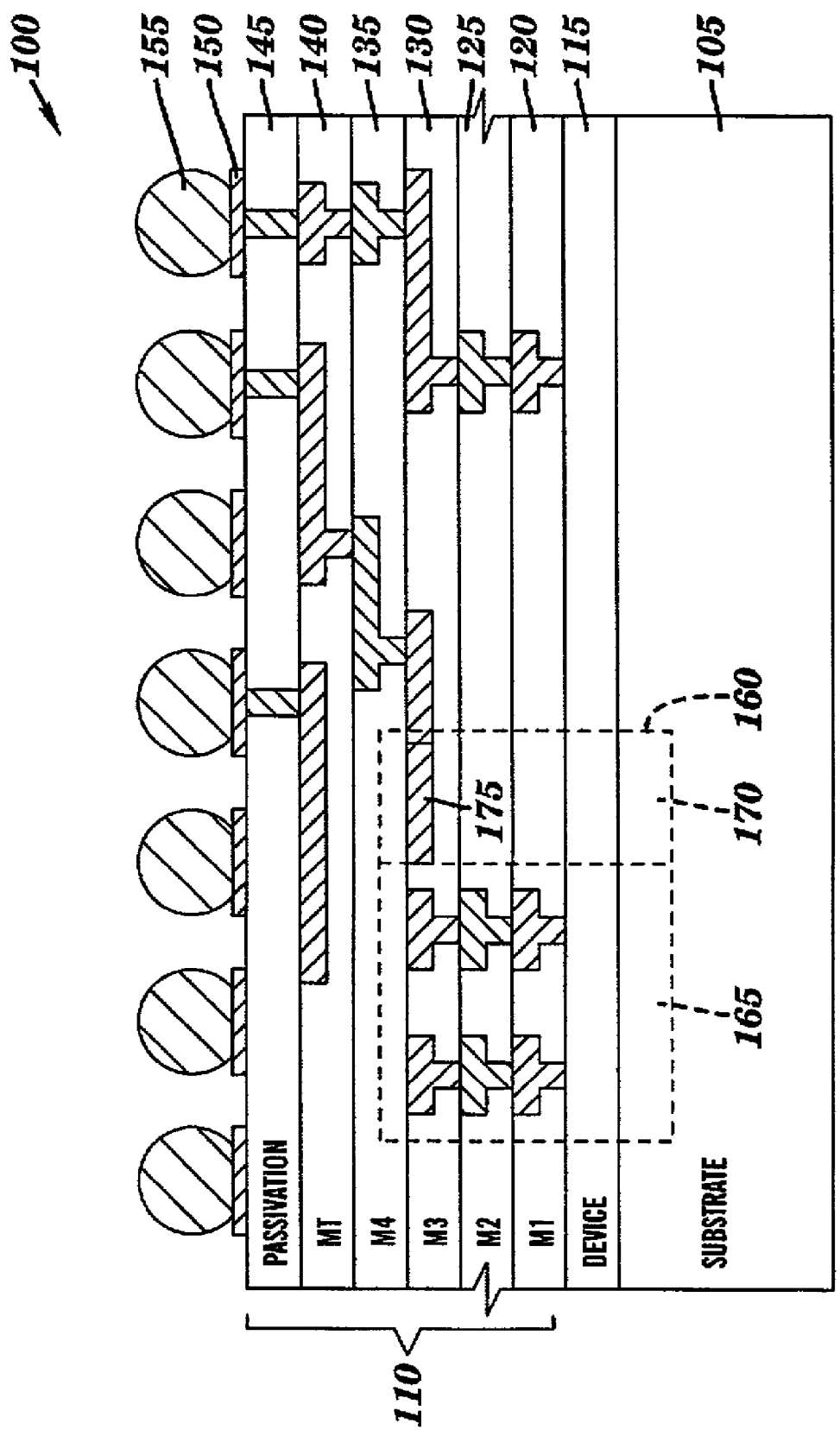
FIG. 1 is a partial cross-sectional view of a related art integrated circuit chip.
Figure 2:
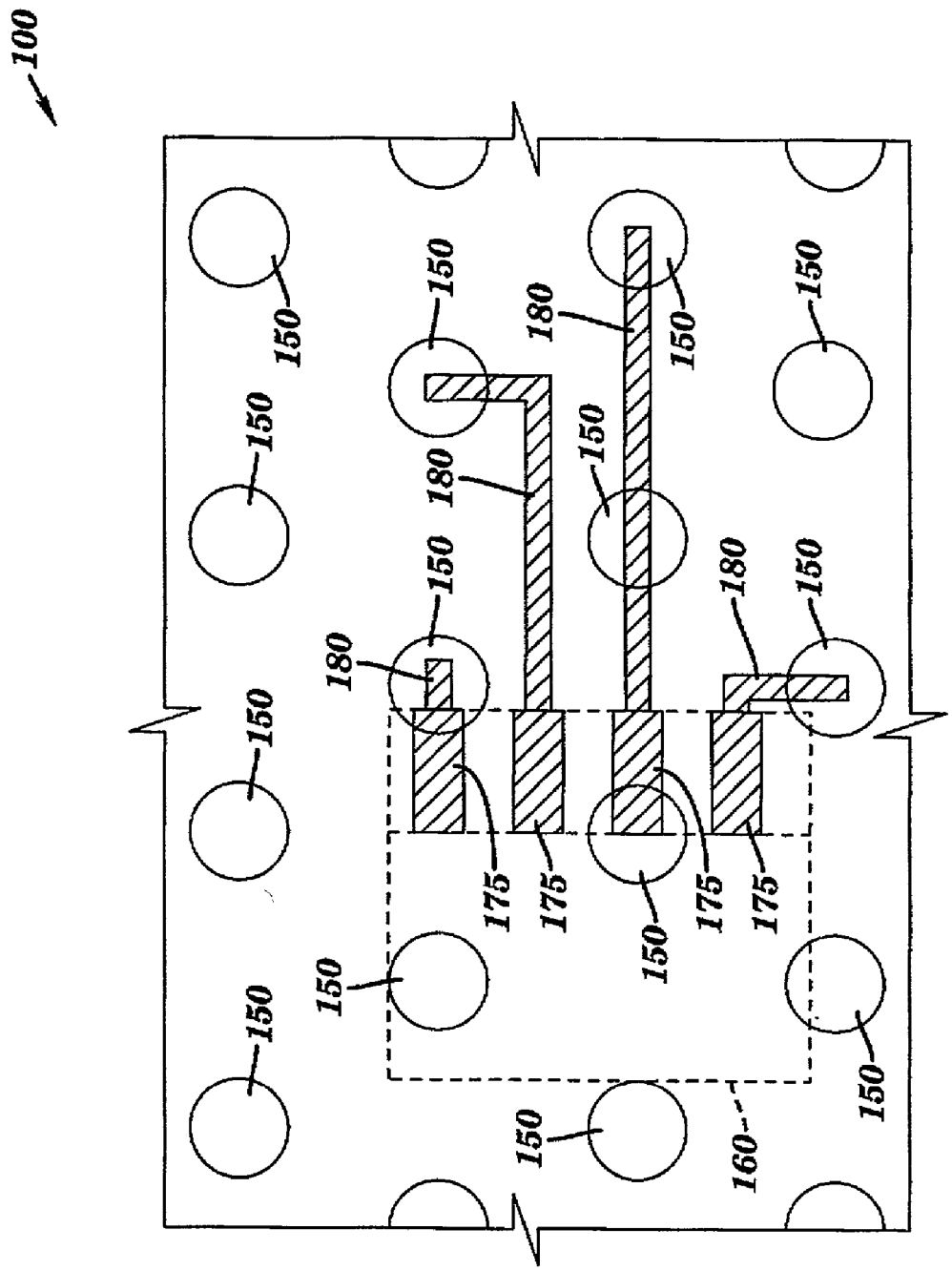
FIG. 2 is a partial plan view of the related art integrated circuit chip of FIG. 1.
Figure 4:
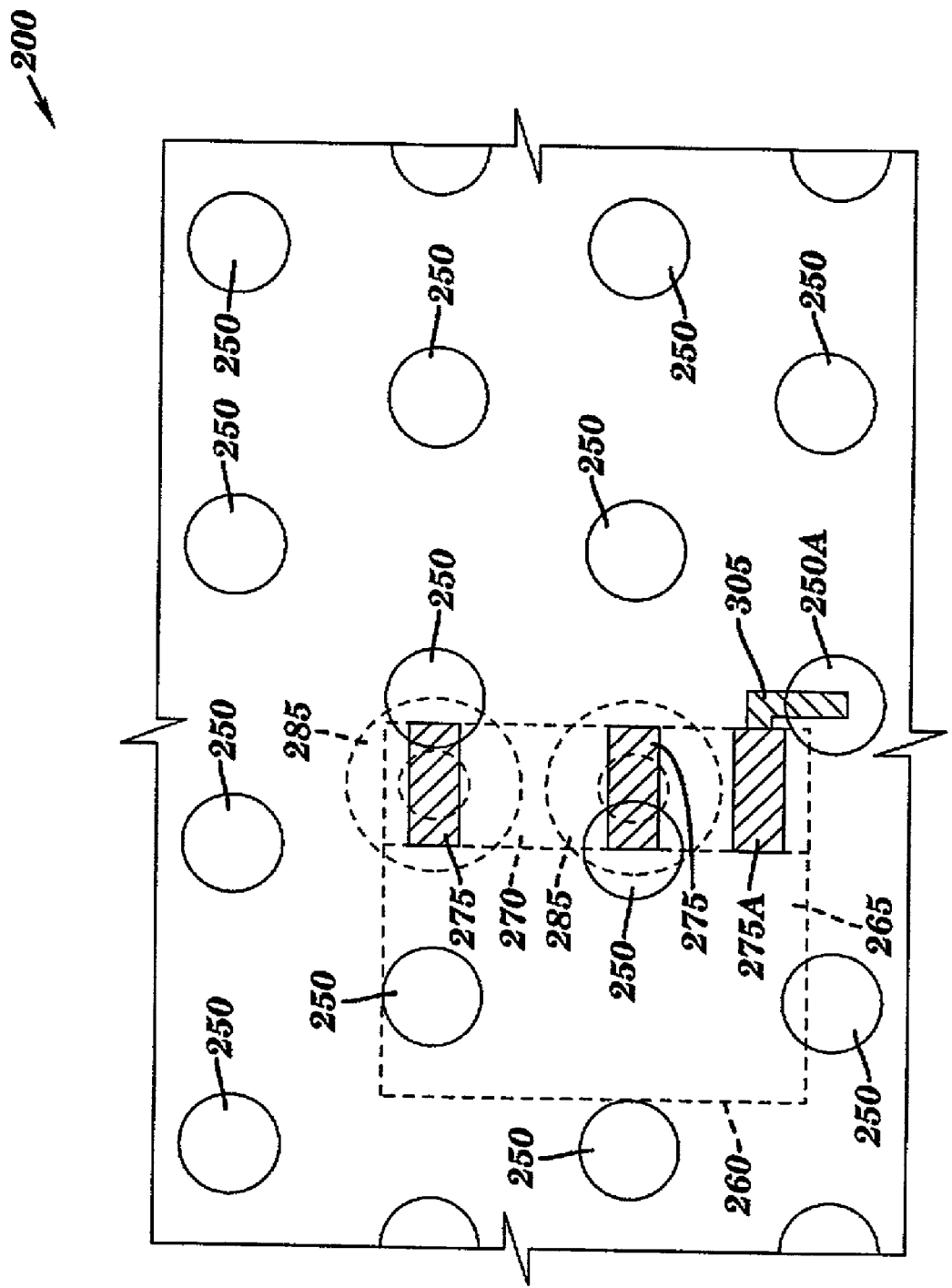
FIG. 4 is a partial plan view of the integrated circuit chip illustrated in FIG. 3, according to the present invention.

FIG. 4 is partial plan view of the integrated circuit chip illustrated in FIG. 3, according to the present invention. In FIG. 2, core I/O pins 275 of core 260 are electrically connected to backside chip I/O pads 280 by conductive backside vias 285. Frontside chip I/O pads 250 are free for use by non-core circuits. An optional connection between a core I/O pin 275A to a frontside chip I/O pad 250A by global wiring 305 is also illustrated in FIG. 4 for those cases in which it is desirable to utilize both types of I/O routing for core 260. Core 260 may be placed anywhere within chip 200 irrespective of frontside chip I/O pads 250 availability or demands on the frontside chip I/O pads by non-core circuits, thus reducing cost, design time and overall time to market.

Figure 5A:
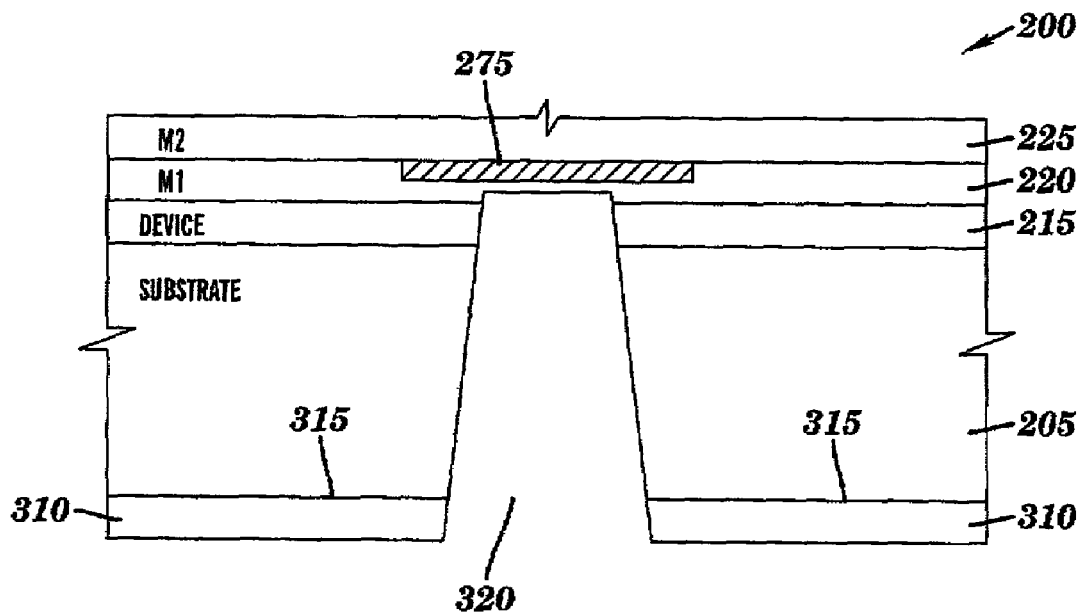
FIGS. 5A through 5D are partial cross-sectional views illustrating fabrication of a backside chip connection according to the present invention.
Figure 7:
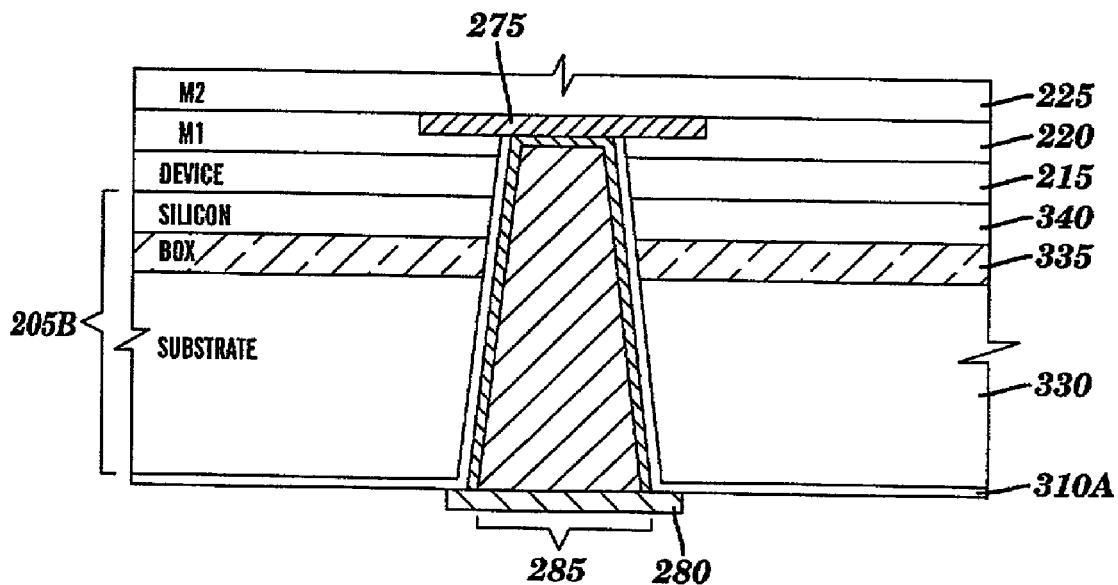
FIG. 7 is a partial cross-sectional view illustrating a silicon-on-insulator (SOI) chip according to the present invention.
Figure 8:
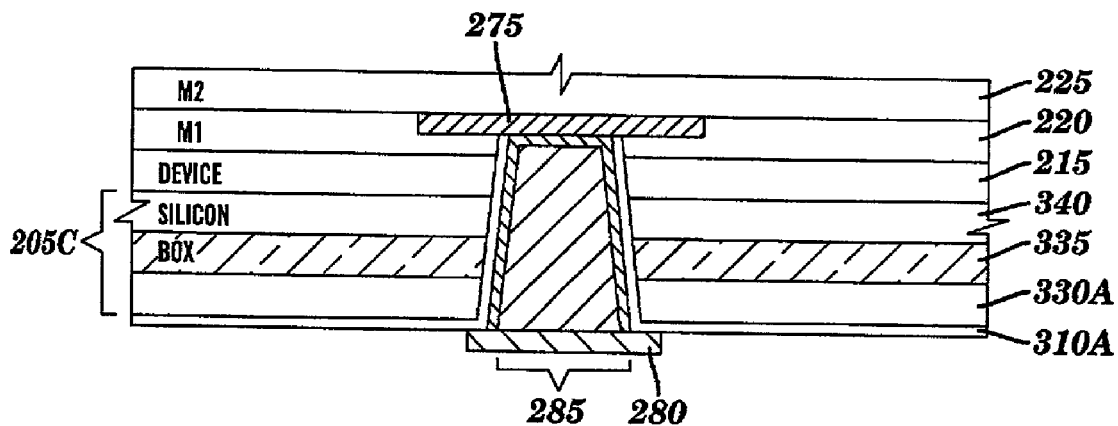
FIG. 8 is a partial cross-sectional view illustrating a thinned SOI chip according to the present invention.

FIGS. 5A through 5D are partial cross-sectional views illustrating fabrication of a backside chip connection according to the present invention. In FIG. 5A, substrate 205, device level 215, M1 level 220 and M2 level of integrated circuit chip 200 are illustrated. Within M1 level 220 is a core I/O pin 275. A thick oxide layer 310 is formed on a backside 315 of substrate 205. In one example, thick oxide layer 310 is high-pressure deposition (HDP) oxide or tetraethoxysilane (TEOS) oxide. A via opening 320 is etched (using thick oxide layer 310 as a hard mask) through thick oxide layer 310, substrate 205, device level 215 and partially into the insulating portion of M1 level 220. If substrate 205 is a bulk silicon substrate the substrate may be etched using any one of well-known silicon etch processes such as wet-etch processes utilizing a strong base or a silicon reactive ion etch processes (RIE). If substrate 205 is an SOI substrate, any one of well-known HF containing wet-etch processes or a silicon oxide RIE processes is also used to etch through the insulator portion of the substrate. An SOI substrate is illustrated in FIGS. 7 and 8 and described below.

Figure 5B:
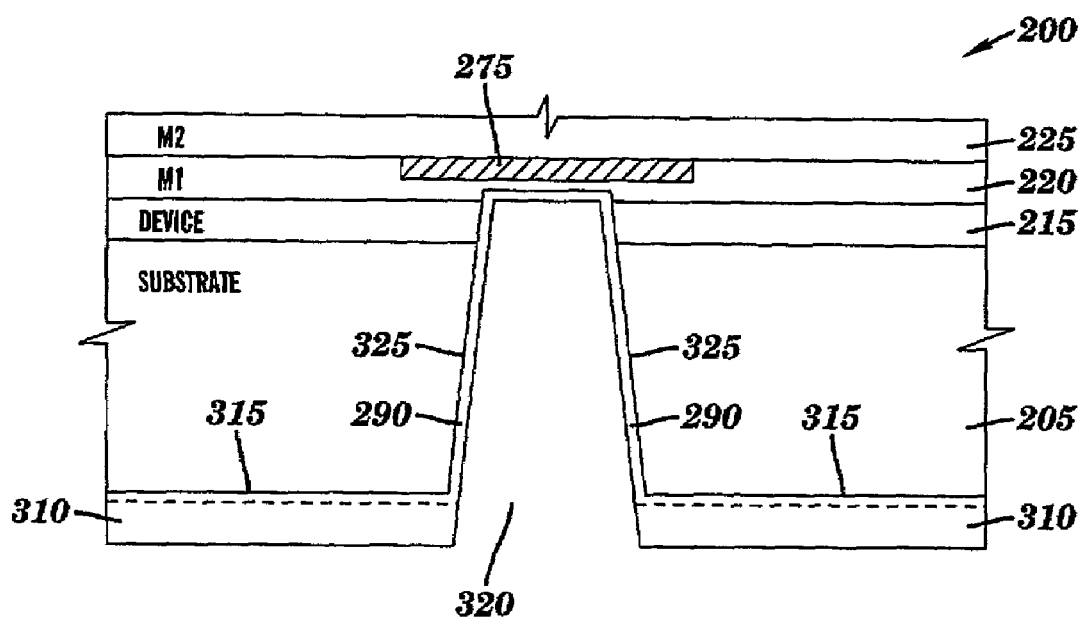

In FIG. 5B, insulating liner 290 is formed on sidewalls 325 of via opening 320. Insulating liner 290 extends over thick oxide layer 310. In a first example, insulating liner 290 may be formed from silicon oxide by deposition or oxidation. In a second example, insulating liner 290 may be formed from silicon nitride by deposition.

Figure 5C:
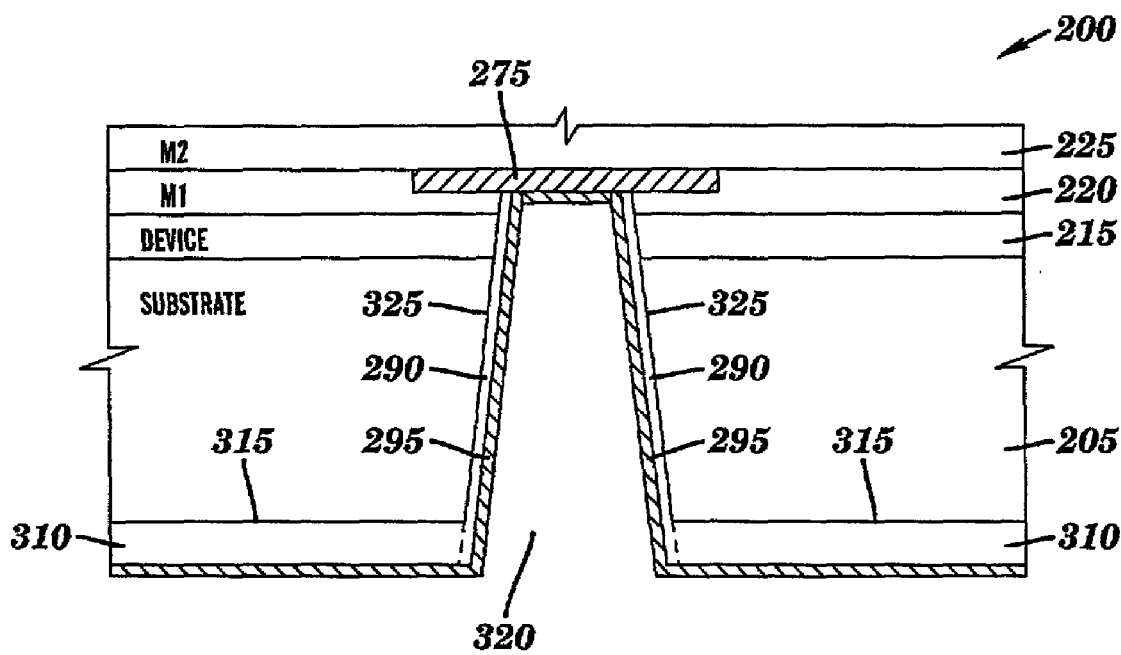

In FIG. 5C, portions of insulating liner 290 and M1 level 220 insulator under core I/O pin 275 are removed by any one of well-known RIE processes. A conductive liner 295 is formed over insulating liner 290. In one example, conductive liner 295 is formed from tantalum or titanium by deposition.

Figure 5D:
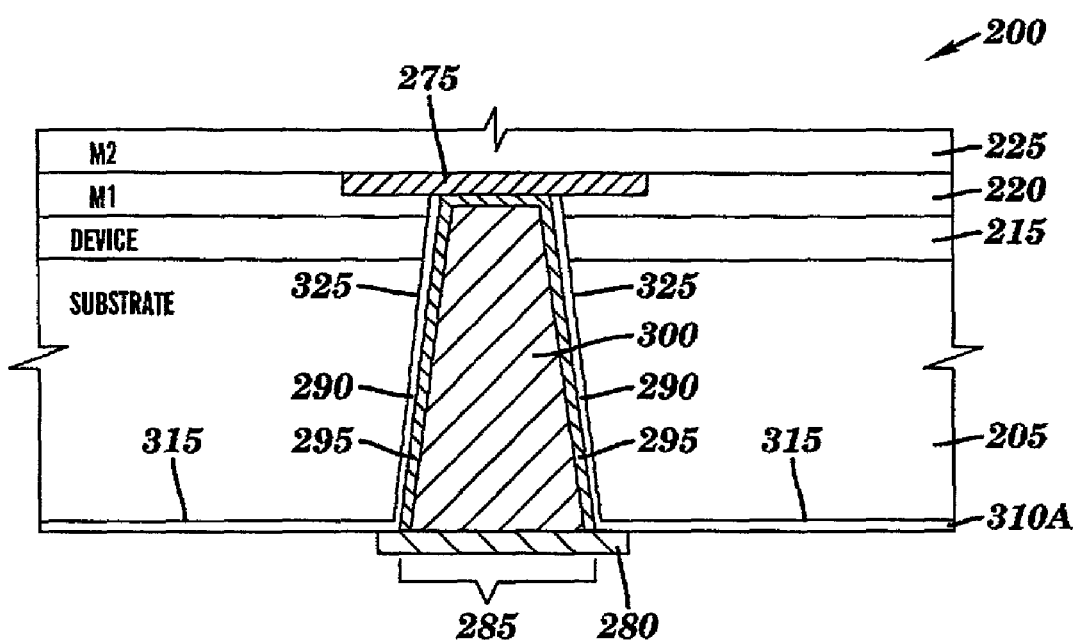

In FIG. 5D, conductive core 300 is formed to complete conductive backside via 285. In a first example, conductive core 300 is copper formed by electroplating followed by a chemical-mechanical-polish (CMP) down to thick oxide layer 310. In a second example, conductive core 300 is tungsten formed by deposition and followed by a CMP down to thick oxide layer 310. Thick oxide layer 310 (see FIG. 5C) is thinned to form thin oxide layer 310A by the CMP process. Backside chip I/O pad 280 is formed over conductive backside via 285. In one example, backside chip I/O pad 280 is aluminum formed by any one of well-known subtractive etch processes.

Figure 6:
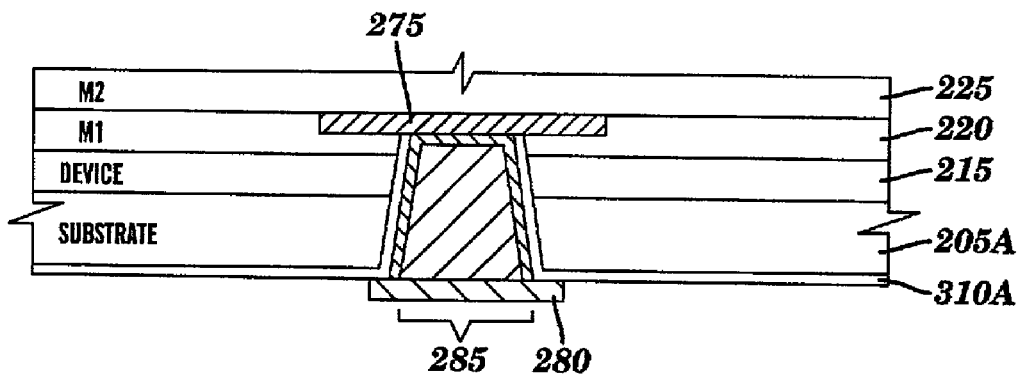
FIG. 6 is a partial cross-sectional view illustrating a thinned bulk silicon chip according to the present invention.

FIG. 6 is a partial cross-sectional view illustrating a thinned bulk silicon chip according to the present invention. In FIG. 6, substrate 205 (see FIG. 5A) is thinned to form thinned substrate 205A before any of the operations illustrated in FIGS. 5A through 5D and described above are performed. Thinning substrate 205 (see FIG. 5A) facilitates formation of via opening 320 (see FIG. 5A). Thinning of substrate 205 (see FIG. 5A) may be accomplished by any one of well-known methods of wet etching in strong basic solutions or by any one of well-known grinding/polishing processes.

FIG. 7 is a partial cross-sectional view illustrating a SOI chip according to the present invention. In FIG. 7, SOI substrate 205B includes a lower silicon layer 330, a middle buried oxide layer (BOX) 335 and an upper silicon layer 340 in which devices are fabricated. Conductive backside via 285 is formed through BOX layer 335.

FIG. 8 is a partial cross-sectional view illustrating a thinned SOI chip according to the present invention. In FIG. 8, substrate 205 (see FIG. 5A) is thinned to form thinned SOI substrate 205C before any of the operations illustrated in FIGS. 5A through 5B and described above are performed. Thinning substrate 205 (see FIG. 5A) facilitates formation of via opening 320 (see FIG. 5A). Thinning of substrate 205 (see FIG. 5A) may be accomplished by any one of the well-known methods of wet etching in strong basic solutions or grinding/polishing processes. Only lower silicon layer 330 (see FIG. 7) is thinned to produce thinned lower silicon layer 330A.

Figure 9:
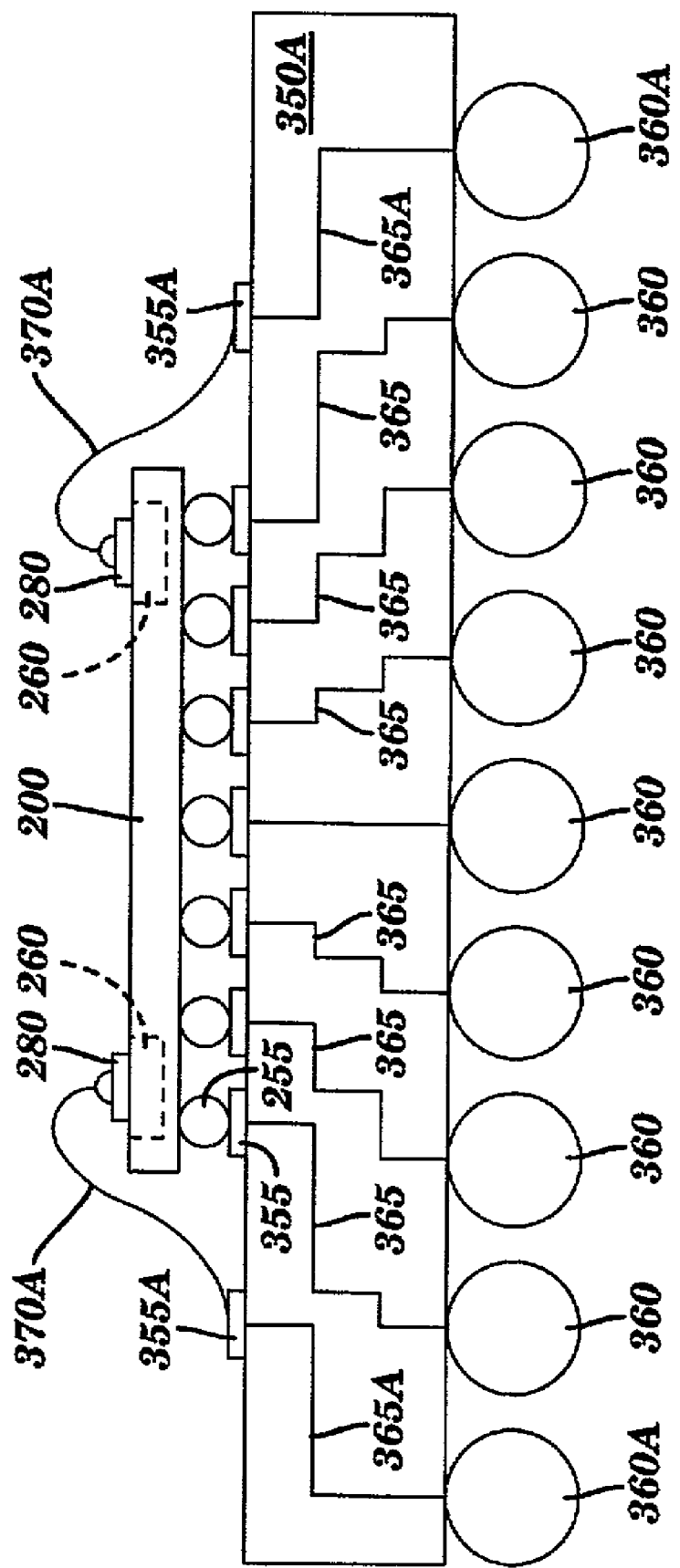
FIGS. 9 through 11 are partial cross-sectional views illustrating alternative package/chip combinations according to the present invention.
Figure 10:
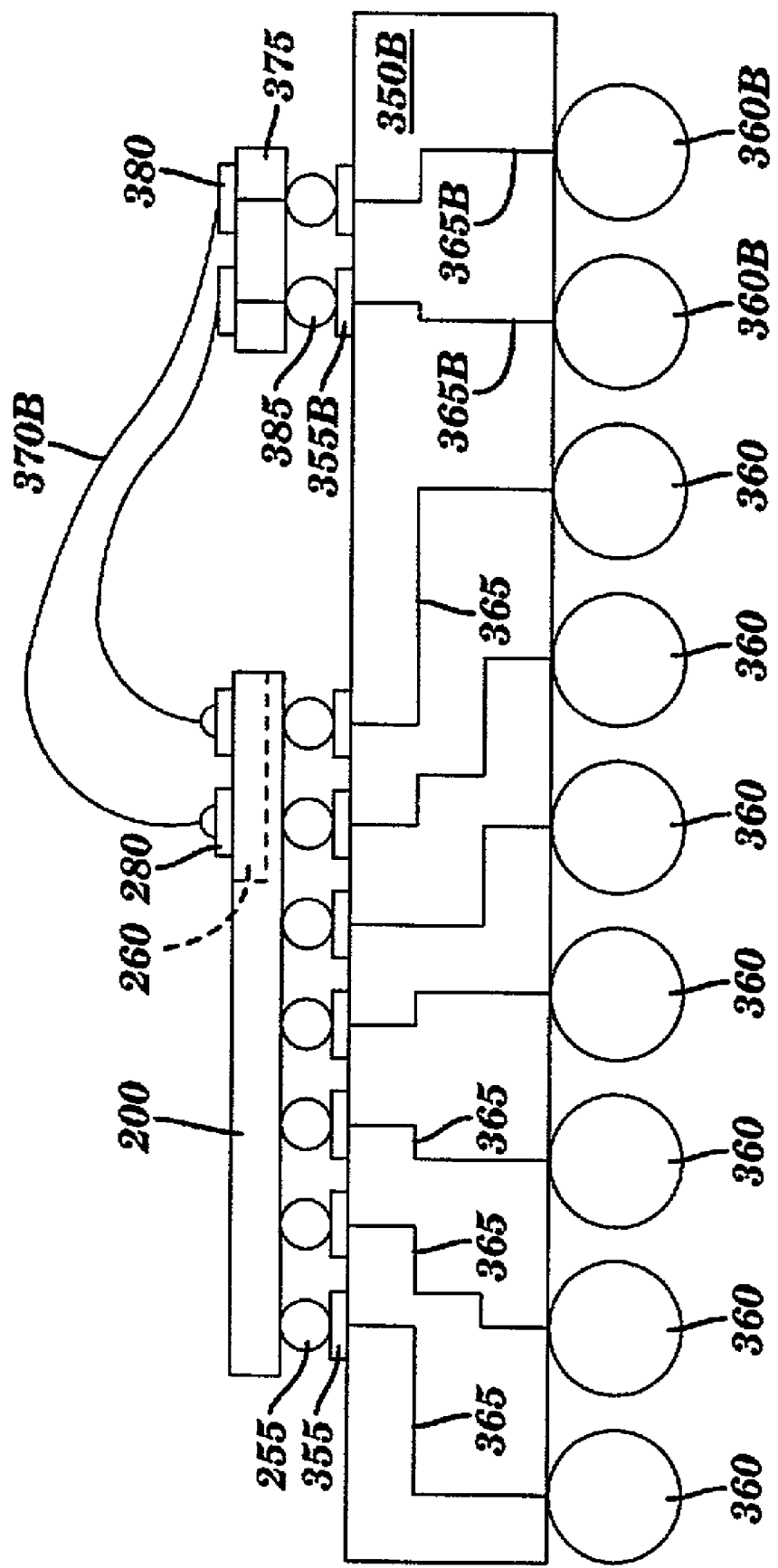
Figure 11:
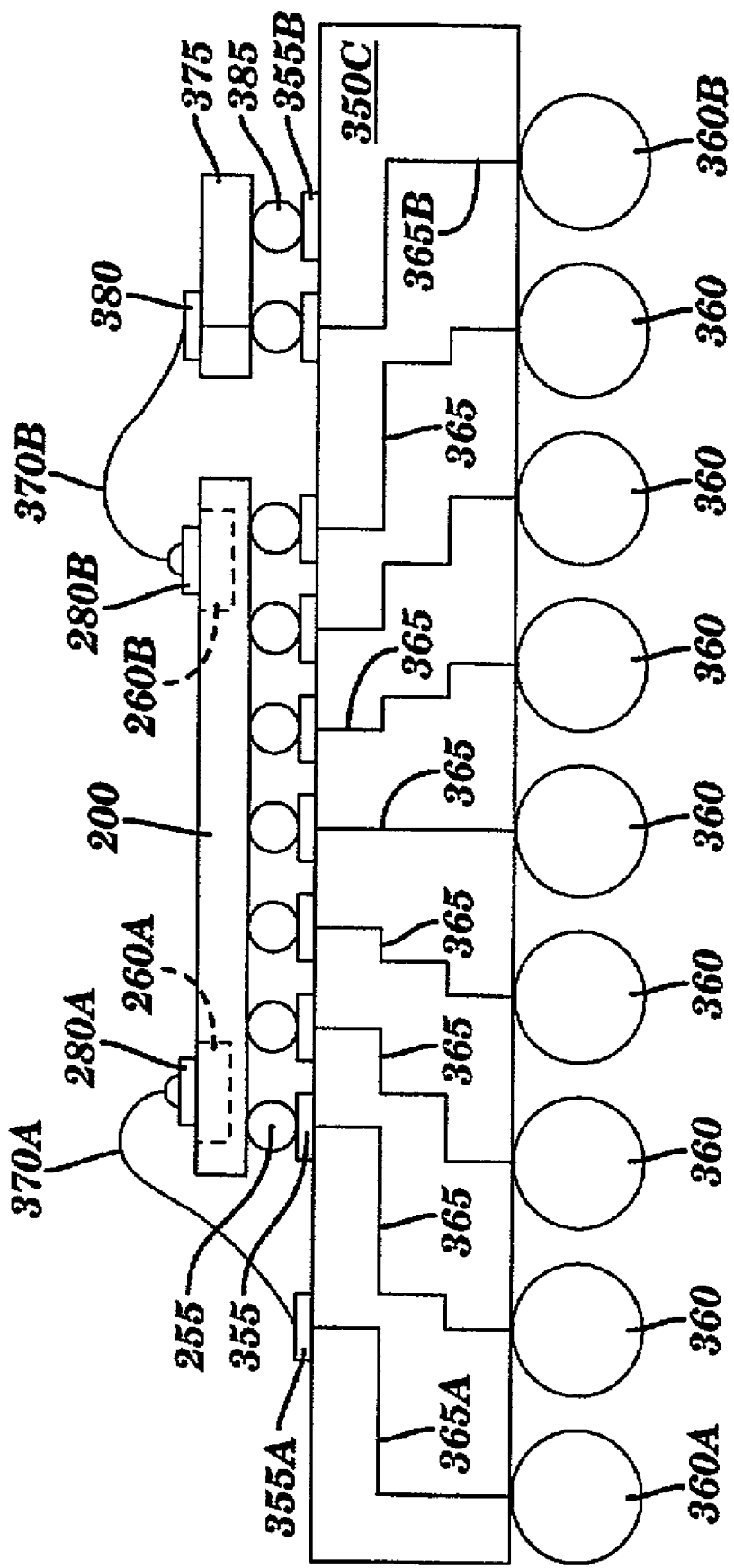

FIGS. 9 through 11 are partial cross-sectional views illustrating alternative package/chip combinations according to the present invention. FIG. 9 illustrates direct coupling of cores to the package. In FIG. 9, a package 350A has C4 pads 355 for electrical connection of solder balls 255 of integrated circuit chip 200 to solder balls 360 by conductive interconnect structures 365. Package 350A also has wirebond pads 355A electrically connected to solder balls 360A by conductive interconnect structures 365A. Backside chip I/O pads 280 from cores 260 in integrated circuit chip 200 are electrically connected to wirebond pads 355A by wirebond wires 370A. In one example, package 350A is a multilevel ceramic (MLC) package and conductive interconnect structures 365 and 365A include conductive lands and vias. While package 350A is a ball grid array (BGA) package, other package types such as pin grid arrays (PGA) and solder column arrays (SCA) may be used.

FIG. 10 illustrates indirect coupling of cores to the package. In FIG. 10, a package 350B has C4 pads 355 for electrical connection solder balls 255 of integrated circuit chip 200 to solder balls 360 by conductive interconnect structures 365. Package 350B also has additional C4 pads 355B electrically connected to solder balls 360B by conductive interconnect structures 365B. A second chip 375 having backside wirebond pads 380 is electrically connected by solder balls 385 to C4 pads 355B. Backside chip I/O pads 280 from cores 260 in chip 200 are connected to backside wirebond pads 380 of second chip 375 by wirebond wires 370B. In one example, package 350B is a multilevel ceramic (MLC) package and conductive interconnect structures 365 and 365B include conductive lands and vias. While package 350B is a ball grid array (BGA) package, other package types such as pin grid arrays (PGA) and solder column arrays (SCA) may be used. Also second chip 375 is defined to include chips having active and/or inactive devices, chips having only conductive interconnect structures and interposers. Interposers may be formed from silicon, quartz, ceramic or other materials known in the art.

In FIG. 11, both types of connections, direct connection of cores to the package as illustrated in FIG. 9 and described above and indirect connection of cores to the package as illustrated in FIG. 10 and described above are combined in a single package.

In FIG. 11, a package 350C has C4 pads 355 for electrical connection of solder balls 255 of integrated circuit chip 200 to solder balls 360 by conductive interconnect structures 365. Package 350C also has wirebond pads 355A electrically connected to solder balls 360A by conductive interconnect structures 365A. Backside chip I/O pads 280A from core 260A in integrated circuit chip 200 are electrically connected to wirebond pads 355A by wirebond wires 370A.

Also in FIG. 11, package 350C has C4 pads 355B electrically connected to solder balls 360B by conductive interconnect structures 365B to solder balls 360B. A second chip 375 having backside wirebond pads 380 electrically connected to solder balls 385 is electrically connected to C4 pads 355B by the solder balls. Backside chip I/O pads 280B from cores 260B in integrated circuit chip 200 are connected to backside wirebond pads 380 of second chip 375 by wirebond wires 370B.

Figure 12:
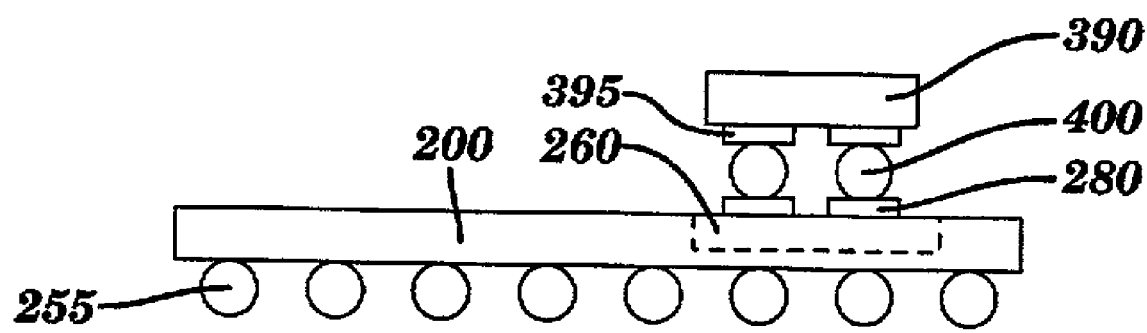
FIGS. 12 and 13 are partial cross-sectional views illustrating methods of mounting two chips together according to the present invention.
Figure 13:
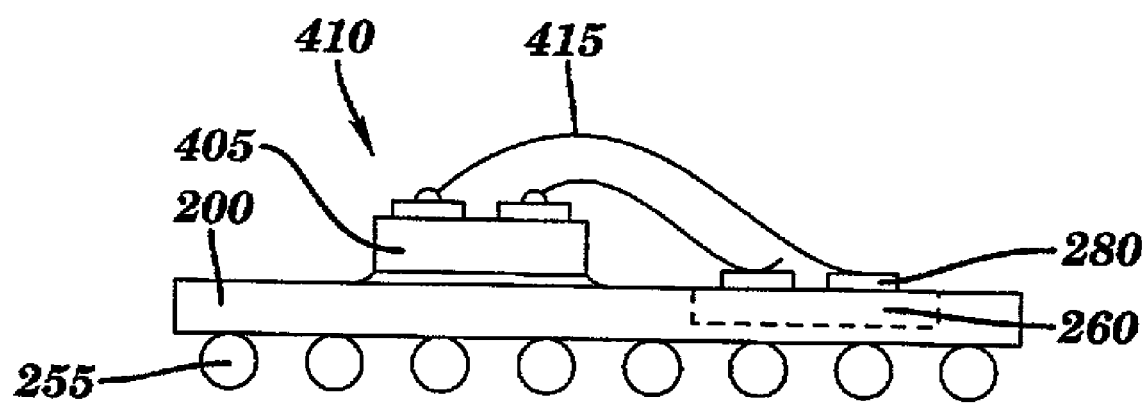

FIGS. 12 and 13 are partial cross-sectional views illustrating methods of mounting two chips together according to the present invention. In FIG. 12, integrated circuit chip 200 includes core 260 having backside chip I/O pads 280. A second chip 390 having frontside I/O pads 395 is electrically connected to backside chip I/O pads 280 by C4 balls 400. In FIG. 13, integrated circuit chip 200 includes core 260 having backside chip I/O pads 280. A second chip 405 having frontside I/O pads 410 is electrically connected to backside chip I/O pads 280 by wirebond wires 415.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore it is intended that the following claims cover all such modifications and changes as fall within the true spirit and scope of the invention.

What is claimed is:

1. An integrated circuit, comprising:
   a predefined block of functional circuitry having a plurality of I/O pins;
   a backside I/O pad electrically connected to each I/O pin through a backside via of the integrated circuit;
   a semiconductor substrate comprising semiconductor portions of devices;
   a device level on the semiconductor substrate and in direct mechanical contact with the semiconductor substrate, wherein the device level includes non-semiconductor portions of said devices;
   a first interconnect level on the device level and in direct mechanical contact with the device level; and
   a second interconnect level on the first interconnect level and in direct mechanical contact with the first interconnect level, wherein the predefined block is a core comprising comprises a circuit portion and a redistribution portion, wherein the circuit portion includes all functional circuitry of the core, wherein the circuit portion includes a first portion of the substrate, a first portion of the device layer, a first portion of the first interconnect level, and a first portion of the second interconnect level, wherein the redistribution portion includes a second portion of the substrate, a second portion of the device layer, and a second portion of the first interconnect level, wherein the second portion of the substrate and the second portion of the device layer do not include any device, and wherein the plurality of I/O pins are contained in their entirety within the second portion of the first interconnect level in the redistribution portion.

2. The integrated circuit of claim 1, wherein the backside via comprises:
   a bulk conductor;
   a conductor liner circumscribing the bulk conductor and in direct mechanical contact with the bulk conductor, wherein an I/O pin of the plurality of I/O pins is in direct mechanical and electrical contact with the conductor liner; and
   an insulating liner circumscribing the conductor liner and in direct mechanical contact with the conductor liner, wherein the insulating liner insulates the bulk conductor from the semiconductor substrate.

3. An integrated circuit, comprising:
   a predefined black of functional circuitry having a plurality of I/O pins; and
   a backside I/O pad electrically connected to each I/O pin through a backside via of the integrated circuit, wherein the backside via comprises:
   a bulk conductor;
   a conductor liner circumscribing the bulk conductor and in direct mechanical contact with the bulk conductor, wherein an I/O pin of the plurality of I/O pins is in direct mechanical and electrical contact with the conductor liner; and
   an insulating liner circumscribing the conductor liner and in direct mechanical contact with the conductor liner, wherein the insulating liner insulates the bulk conductor from the semiconductor substrate.

4. The integrated circuit of claim 3, wherein said backside via is formed in a bulk silicon substrate or a silicon-on-insulator substrate of the integrated circuit.

5. The integrated circuit of claim 3, wherein said predefined block of functional circuitry includes a first portion containing functional circuitry and a second portion containing said I/O pins, and wherein said backside vias connect to said I/O pins in said second portion.

6. The integrated circuit of claim 3, further including:
   a plurality of frontside I/O pads; and
   additional I/O pins, each additional I/O pin electrically connected to one frontside I/O pad of the integrated circuit by a global wiring connection.

7. The integrated circuit of claim 3, wherein the backside via comprises a sloped sidewall.

8. The integrated circuit of claim 3, wherein a first portion of the backside I/O pad is in direct mechanical contact with the backside via, wherein a second portion of the backside I/O pad is not in direct mechanical contact with the backside via, and wherein the second portion of the backside I/O pad is in direct mechanical contact with a backside surface of the integrated circuit.

9. The integrated circuit of claim 3, wherein the backside via extends through a buried oxide layer (BOX) of the integrated circuit.

10. A method of making electrical connection to an integrated circuit, comprising:
    providing a predefined block of functional circuitry having a plurality of I/O pins;
    connecting a backside I/O pad electrically to each I/O pin through a backside via of the integrated circuit;
    providing a semiconductor substrate comprising semiconductor portions of devices;
    providing a device level on the semiconductor substrate and in direct mechanical contact with the semiconductor substrate, wherein the device level includes non-semiconductor portions or said devices;
    providing a first interconnect level on the device level and in direct mechanical contact with the device level; and
    providing a second interconnect level on the first interconnect level and in direct mechanical contact with the first interconnect level, wherein the predefined block is a core comprising comprises a circuit portion and a redistribution portion, wherein the circuit portion includes all functional circuitry of the core, wherein the circuit portion includes a first portion of the substrate, a first portion of the device layer, a first portion of the first interconnect level, and a first portion of the second interconnect level, wherein the redistribution portion includes a second portion of the substrate, a second portion of the device layer, and a second portion of the first interconnect level, wherein the second portion of the substrate and the second portion of the device layer do not include any device, and wherein the plurality of I/O pins are contained in their entirety within the second portion of the first interconnect level in the redistribution portion.

11. The method of claim 10, further including:
providing additional predefined circuit I/O pins; and
electrically connecting each additional I/O pin to one frontside I/O pad of the integrated circuit by a global wiring connection.

12. The integrated circuit of claim 10, wherein the backside via comprises:
a bulk conductor;
a conductor liner circumscribing the bulk conductor and in direct mechanical contact with the bulk conductor, wherein an I/O pin of the plurality of I/O pins is in direct mechanical and electrical contact with the conductor liner; and
an insulating liner circumscribing the conductor liner and in direct mechanical contact with the conductor liner, wherein the insulating liner insulates the bulk conductor from the semiconductor substrate.

13. A method of making electrical connection to an integrated circuit, comprising:
providing a predefined block of functional circuitry having a plurality of I/O pins; and
connecting a backside I/O pad electrically to each I/O pin through a backside via of the integrated circuit, wherein the backside via comprises:
a bulk conductor;
a conductor liner circumscribing the bulk conductor and in direct mechanical contact with the bulk conductor, wherein an I/O pin of the plurality I/O pins is in direct mechanical and electrical contact with the conductor liner; and
an insulating liner circumscribing the conductor liner and in direct mechanical contact with the conductor liner, wherein the insulating liner insulates the bulk conductor from the semiconductor substrate.

14. The method of claim 13, further including:
providing additional I/O pins; and
electrically connecting each additional I/O pin to one frontside I/O pad of the integrated circuit by a global wiring connection.

15. The method of claim 13, further including:
forming said backside via in a bulk silicon substrate or a silicon on insulator substrate.

16. The method of claim 13, wherein the backside via comprises a sloped sidewall.

17. The method of claim 13, wherein a first portion of the backside I/O pad is in direct mechanical contact with the backside via, wherein a second portion of the backside I/O pad is not in direct mechanical contact with the backside via, and wherein the second portion of the backside I/O pad is in direct mechanical contact with a backside surface of the integrated circuit.

18. The method of claim 13, wherein the backside via extends through a buried oxide layer (BOX) of the integrated circuit.

19. The method of claim 13, wherein said I/O pins are formed in a lowest interconnect level of the integrated circuit.

* * * * *

UNITED STATES PATENT AND TRADEMARK OFFICE
CERTIFICATE OF CORRECTION

PATENT NO. : 6,960,837 B2
DATED : November 1, 2005
INVENTOR(S) : Iadanza

It is certified that error appears in the above-identified patent and that said Letters Patent is hereby corrected as shown below:

Column 7,
Line 63, delete "black" and insert -- block --.

Column 8,
Line 47, delete "or" and insert -- of --.

Signed and Sealed this

Tenth Day of January, 2006

JON W. DUDAS
*Director of the United States Patent and Trademark Office*